US006585338B2

(12) United States Patent
Harris

(10) Patent No.: US 6,585,338 B2
(45) Date of Patent: Jul. 1, 2003

(54) QUICK START RESONANT CIRCUIT CONTROL

(75) Inventor: William A. Harris, Coon Rapids, MN (US)

(73) Assignee: Honeywell International Inc., Morristown, NJ (US)

( * ) Notice: Subject to any disclaimer, the term of this patent is extended or adjusted under 35 U.S.C. 154(b) by 69 days.

(21) Appl. No.: 09/746,268

(22) Filed: Dec. 22, 2000

(65) Prior Publication Data

US 2003/0090334 A1 May 15, 2003

(51) Int. Cl.[7] .............................. H03B 5/30; H03L 7/06
(52) U.S. Cl. .............................. 321/4; 331/18; 331/154; 331/156; 331/DIG. 2
(58) Field of Search .............................. 331/4, 18, 25, 331/74, 116 R, 116 FE, 116 M, 154, 158, 156, 173, DIG. 2

(56) References Cited

U.S. PATENT DOCUMENTS

| 3,743,960 | A | * | 7/1973 | Steudel ........................ 331/1 A |
| 4,275,363 | A | * | 6/1981 | Mishiro et al. ................. 331/4 |
| 5,113,116 | A | * | 5/1992 | Wilson ........................ 310/316 |
| 5,897,569 | A | * | 4/1999 | Kellogg et al. .............. 606/169 |
| 6,084,481 | A |   | 7/2000 | Westerman et al. ........... 331/25 |
| 6,157,804 | A | * | 12/2000 | Richmond et al. ........... 399/319 |

FOREIGN PATENT DOCUMENTS

| EP | 0863616 | 9/1998 | ............. H03L/7/12 |
| EP | 0947803 | 10/1999 | ............ G01C/19/56 |
| GB | 2266149 | 10/1993 | ............. G01P/9/04 |

\* cited by examiner

*Primary Examiner*—David C. Mis
(74) *Attorney, Agent, or Firm*—Matthew S. Luxton

(57) ABSTRACT

A circuit and method for assuring rapid initiation of resonant oscillation of an electromechanically oscillatory system driven by phase lock loop circuits. An open loop starting signal commences driving of the object at a starting frequency above the resonant frequency. The starting signal reduces the drive frequency until the resonant frequency of the system is reached and the starting signal is removed.

20 Claims, 3 Drawing Sheets

QUICK START RESONANT CIRCUIT CONTROL

TECHNICAL FIELD

The present invention concerns the problem of improving the performance of a resonant circuit and, more particularly, the startup of a resonant tuning fork driven by an amplifier in a phase locked loop circuit.

BACKGROUND OF THE INVENTION

Piezoelectric vibratory gyroscopes utilizing vibratory eletrostatically driven tuning forks are being used in a variety of angular velocity measuring applications. In such applications the tuning fork may be excited in a closed loop drive circuit which includes a phase locked loop.

Phase locked loop resonant drive circuits measure the phase difference between a sensor signal indicative of vibration of tuning fork and the drive signal applied to the amplifier providing the drive signal which drives the vibration of the tuning fork. A problem may arise in the starting of such circuits because upon the initial application of power, the tuning fork produces no output feedback signal to the phase comparator because it is not yet vibrating. At that time the output frequency of the voltage contolled oscillator, VCO, has no correlation to the tuning fork frequency because it is initially receiving a zero input signal. Such systems start up, eventually, when amplified white noise present in the system starts to be positively fed back through the system.

Where the tuning fork sensor has a resonant frequency $f_0$, and the efficiency of the resonant system is Q, the starting time may be determined by dividing Q divided by $f_0$. For vacuum tuning fork sensors with electrostatic drive and pickoffs, a typical Q of 100,000 and $f_0$ of 20,000 may require starting times of as long as five seconds. While this starting time could be reduced if the tuning fork were initially overdriven at the resonant frequency at the time that it was turned on, it has proven difficult to predict the resonant frequency of the fork in a particular circuit since it is common for them to have a resonant frequency that may vary in the ±20% range between similar tuning forks. Also, to be effective, the drive frequency must be within $\pm f_0$ divided by Q cycles of the sensor resonant frequency.

SUMMARY

A phase locked loop circuit for driving an oscillatory mechanical object, which, when constructed according to the preferred embodiments of the present invention uses an amplifier for providing a drive signal to the mechanical object in response to an input signal, a phase detector for receiving a first signal and a second signal proportional to the movement of the mechanical object, the phase detector constructed and arranged for comparing the phase of the first and second signals and for providing an output signal having an average voltage proportional to the phase difference between the first and second signals, a voltage controlled oscillator receiving the output signal from the phase detector and producing an output signal which is the first signal received by the phase detector and an input of the amplifier, and a signal source for providing the voltage controlled oscillator with a starting signal at the time that power is applied to the system such that the frequency of the output of the voltage controlled oscillator commences at an initial frequency of the voltage controlled oscillator which is higher than a resonant frequency of the mechanical object, the signal source constructed and arranged for reducing the output frequency of the voltage controlled oscillator until the it corresponds to the resonant frequency of the mechanical object.

The apparatus and method may also use a voltage controlled oscillator, a driver circuit for providing a signal for driving the mechanical object at a frequency determined by the voltage controlled oscillator, a drive signal source for providing a starting drive signal to the voltage controlled oscillator when power is applied to the circuit prior to commencement of the oscillation of the mechanical object, the starting drive signal providing an output from the voltage controlled oscillator at a starting frequency predetermined to be above the range of expected resonant frequencies of the mechanical object, the starting drive signal varying with time to reduce the output frequency of the voltage controlled oscillator, a phase detector for comparing the phase difference between the output of the voltage controlled oscillator and a feedback signal indicative of the oscillatory motion of the mechanical object and providing an error signal to the input of the voltage controlled oscillator having an average voltage proportional to that phase difference, and a switch for removing the starting drive signal from the input of the voltage controlled oscillator when the frequency of the oscillatory motion of the mechanical object reaches a resonant frequency of the mechanical object.

A method of starting a closed loop resonant drive circuit for a mechanical object may involve providing an open loop starting signal to the circuit for initially driving the mechanical object at a frequency well above the range of frequencies expected for the resonant frequency of the mechanical object, varying the starting signal for sweeping the driving frequency to lower frequencies until the resonant frequency of the mechanical object is reached, and removing the starting signal while the mechanical object continues to oscillate at the resonant frequency.

A method of rapidly initiating oscillation of a resonant mechanical system driven by a phase lock loop circuit comprising an amplifier having a positive feedback path may also involve applying a decaying open loop starting voltage to the VCO (voltage controlled oscillator) input of a phase lock loop circuit so that the phase lock loop circuit output frequency starts at a maximum frequency which is above the resonant frequency of the mechanical system and sweeps downwardly toward a minimum frequency below the resonant frequency of mechanical system, allowing the phase locked loop circuit to lock at the resonant frequency of the mechanical element when the frequency of VCO reaches the resonant frequency of the mechanical system; and removing the starting voltage.

A method of rapidly initiating oscillation of a resonant mechanical system driven by a phase lock loop circuit comprising an amplifier having a positive feedback path may involve applying a decaying open loop starting voltage to the voltage controlled oscillator input of a phase lock loop circuit so that the phase lock loop circuit output frequency starts at a maximum frequency which is above the resonant frequency of the mechanical system and sweeps downwardly toward a minimum frequency below the resonant frequency of mechanical system, allowing the phase locked loop circuit to lock at the resonant frequency of the mechanical element when the frequency of the voltage controlled oscillator reaches the resonant frequency of the mechanical element, generating a lock signal to indicate that the phase locked loop circuit is locked, and removing the starting voltage in response to the lock signal.

DETAILED DESCRIPTION OF THE PREFERRED EMBODIMENT

Figure 1:
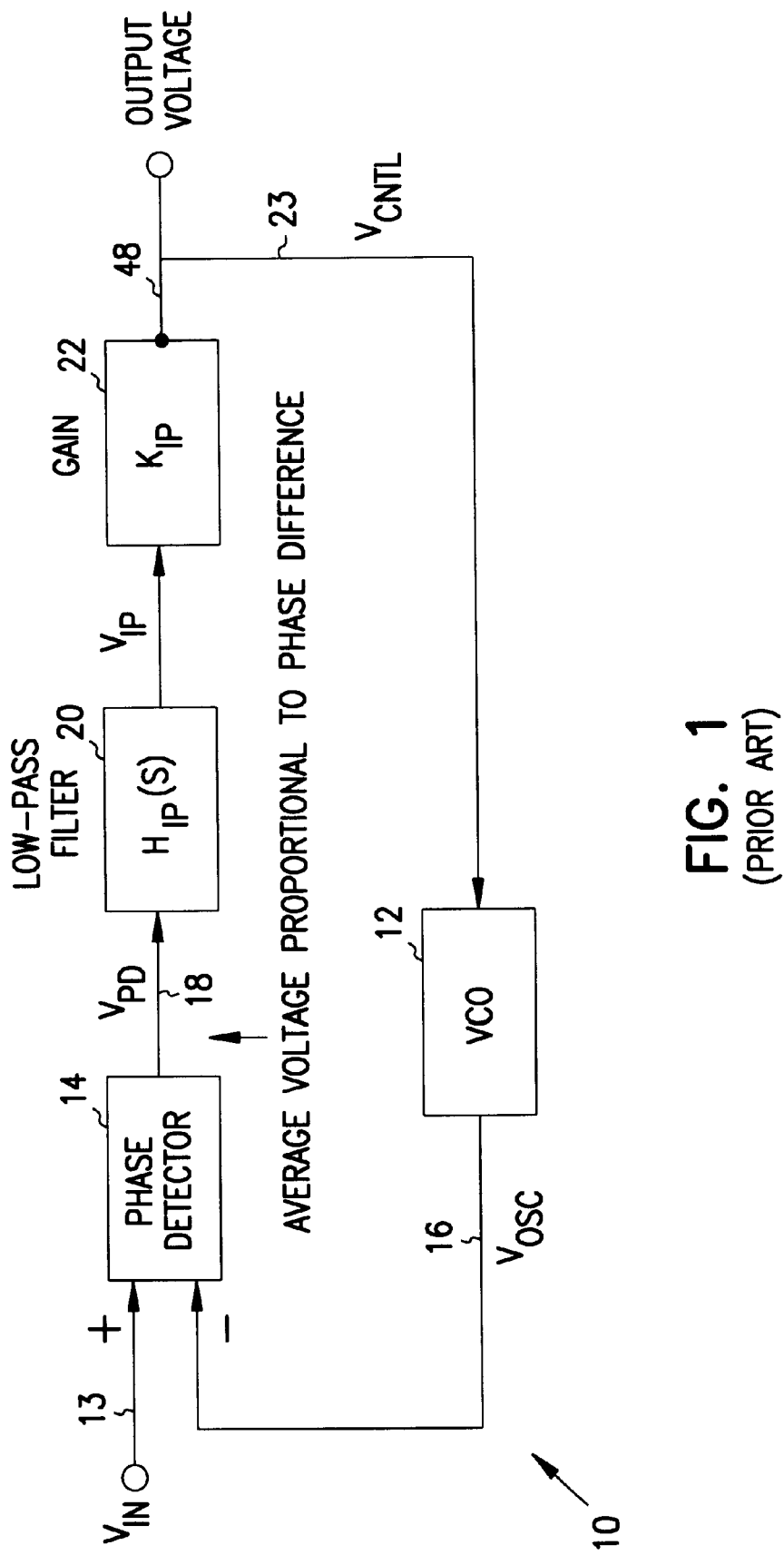
FIG. 1 shows a block diagram of a prior art phase locked loop circuit.

FIG. 1 shows a block diagram of a prior art phase locked loop circuit 10 in which a voltage controlled oscillator (VCO) 12 is phase locked to a reference signal 13 received from an external source $V_{in}$. A phase detector 14 continuously monitors the phase difference between the reference signal 13 and a feedback signal 16 which is an output signal of voltage controlled oscillator 12. Feedback signal 16 is either provided by voltage controlled oscillator 12 directly or, it may alternatively be derived from the voltage controlled oscillator 12 as an intermediate frequency (IF) signal from a mixer driven by a local oscillator (not shown). Phase detector 14 generates an output error voltage 18 that is further processed by a low pass filter 20 and a loop amplifier gain stage 22 in the forward path of the phase locked loop. Output voltage 23 is fed back to the input of VCO 12 to control the frequency and phase of the output signal 16 of phase locked loop 10. Phase locked loop 10 is maintained in the locked state when the voltage controlled oscillator 12 output error signal 16 is within a prescribed capture range.

Figure 2:
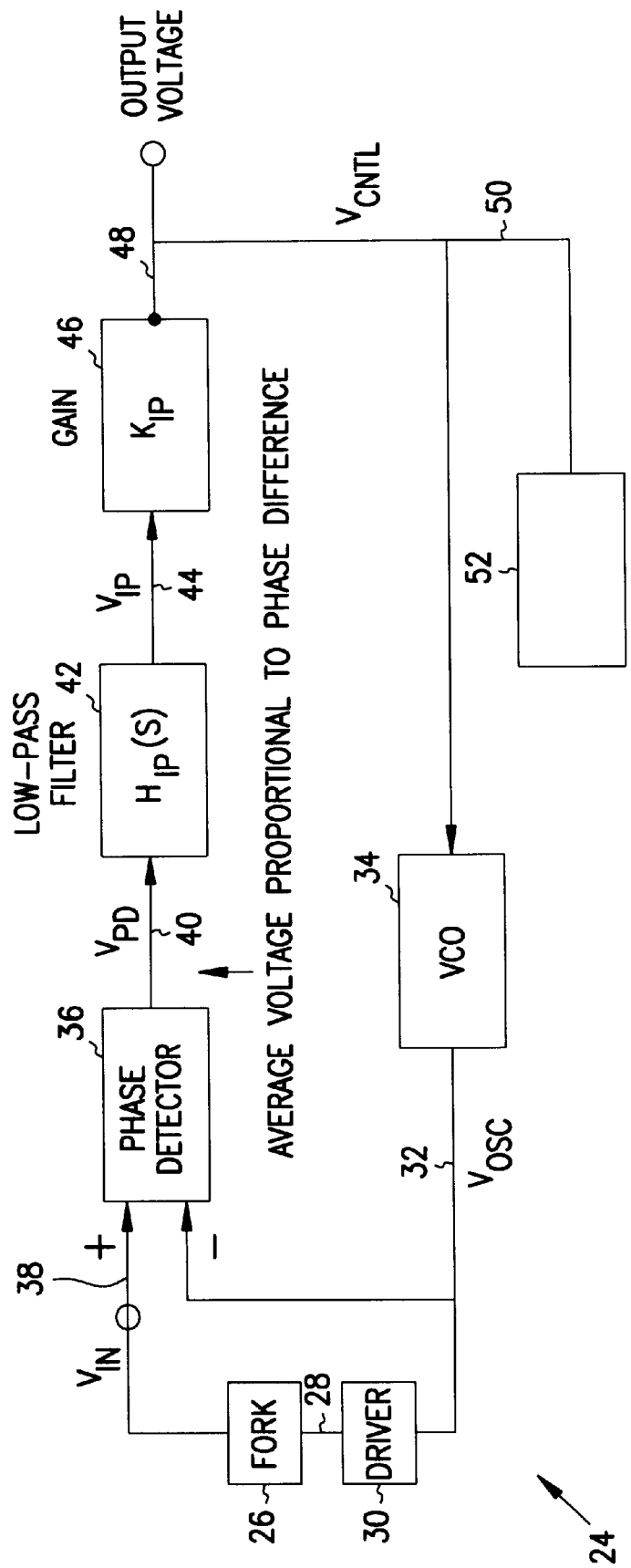
FIG. 2 shows a block diagram view of an embodiment of the present invention.

FIG. 2 is a block diagram of a phase locked loop circuit 24 in accordance with one embodiment of the present invention for driving a high Q resonant mechanical object 26 at a resonant frequency of the mechanical object. In one embodiment, the resonant mechanical object is an electrostatically driven silicon micromachined tuning fork 26 which may find use in a number of rate and acceleration sensing applications.

The resonant mechanical object 26 is constructed and adapted to receive and be driven by a time varying drive signal 28. Such a drive signal 28 is provided in FIG. 2 by an amplifier or driver circuit 30. Where tuning fork 26 is electrostatically driven, driver circuit 30 may in one embodiment be an automatic gain controlled amplifier which provides a drive signal 28 at a fixed amplitude at the frequency of output signal 32 of voltage controlled oscillator 34.

The forward loop of phase locked loop 24 comprises a phase detector 36 which receives a feedback signal 38 from mechanical object 26 which is indicative of the oscillatory motion of the mechanical object. Phase detector 36 compares feedback signal 38 to the output signal 32 of voltage controlled oscillator 34 and provides an output signal 40 which is coupled to filter 42 which, in one embodiment is a low pass filter. Low pass filter 42 delivers an output voltage 44 to an amplifier stage 46 which produces an output voltage 48. The feedback loop is closed by connecting output voltage 48 to the input of VCO 34.

At the time that the circuit of FIG. 2 initially receives power, tuning fork 26 is not vibrating so that there is no feedback signal provided to phase detector 38 from tuning fork 26. Because VCO 34 is starting with no output voltage 48 being delivered from amplifier 46, its output is at a minimum frequency as determined by the electronic component values of VCO 34. Thus phase detector 36 initially has input signal 32 but signal 38 is at a near zero level. Only white noise from amplifier 46 is initially present in the loop. Eventually, the noise generates enough of a signal to provide an output signal 28 which, in turn, begins to apply a signal to start driving tuning fork 26.

As the noise signal 28 increases, the vibration amplitude of tuning fork 26 also increases and the phase detector input 38 reaches a sufficient level to allow the phase lock loop to achieve lock at the resonant frequency of fork 26. Since fork 26 has a very high Q or a narrow vibration/signal bandwidth, signal 38 is predominantly the resonant frequency of fork 26 despite the fact that signal 28 also contained white noise and signals that were displaced from the resonant frequency.

In order to more quickly commence operation of resonant drive circuit 24 of FIG. 2, a starting signal 50 is provided from a drive signal source 52. In one embodiment, starting signal 50 is a high voltage which initially drives voltage controlled oscillator 34 at a frequency which is above the range of expected variation of a resonant frequency of tuning fork 26. In one embodiment, starting signal 50 is reduced in amplitude to sweep the frequency of the output of voltage controlled oscillator downwardly. When the frequency of the voltage controlled oscillator reaches a resonant frequency of tuning fork 26, phase locked loop 24 locks and drive signal source 50 removes starting signal 52 so that the phase locked loop continues to operate at the resonant frequency of tuning fork 26.

Figure 3:
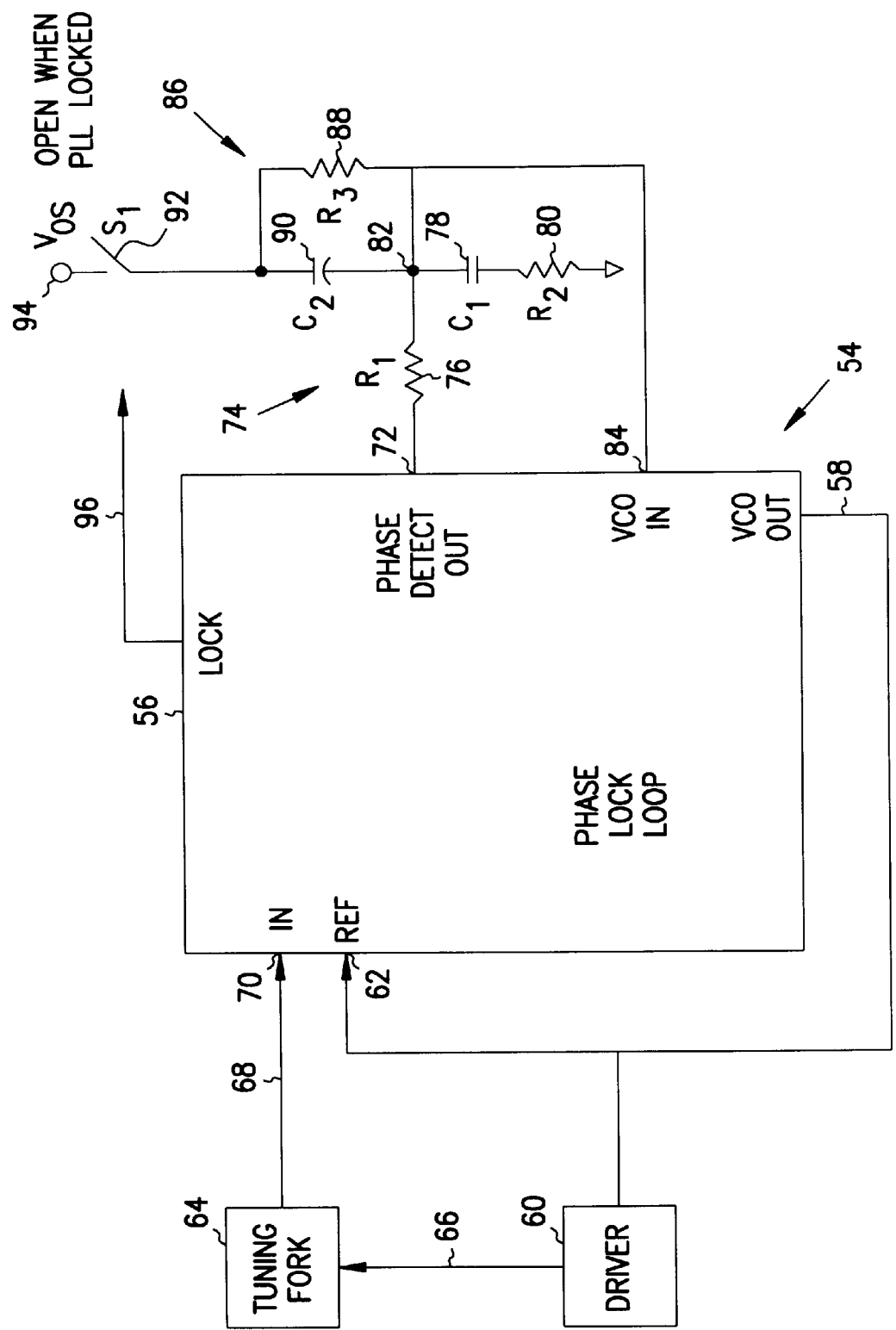
FIG. 3 shows a more detailed, partially schematic view of an embodiment of the present invention.

FIG. 3 shows an embodiment of the resonant drive circuit 54. A phase locked loop integrated circuit 56 is connected with its VCO output signal 58 coupled to driver circuit 60 and to the reference input 62 of phase locked loop circuit 56. Driver circuit 60 drives tuning fork 64 with a drive signal 66. As tuning fork 64 oscillates, a feedback signal 68, indicative of the oscillatory motion of tuning fork 64, is coupled to the input terminal 70 of phase lock loop circuit 56. The signal at phase detector output terminal 72 is connected to a first order filter 74 comprised of a resistor 76, a capacitor 78 and a resistor 80. The output of filter 74 is coupled from output terminal 82 to the input 84 of voltage controlled oscillator on circuit 56. A driver circuit 86 comprised of a resistor 88, a capacitor 90 and a switch 92 is connected to a positive voltage source 94.

In one embodiment, the resistance of resistor 88 is much larger than that of resistor 76 and the capacitance of capacitor 90 is much larger than the capacitance of capacitor 78. Switch 92 is closed when power is applied to the circuit. The input 84 to the voltage controlled oscillator starts high and then sweeps down at a rate which is in accordance with the time constant of resistor 76 and capacitor 90. The output 58 of the voltage controlled oscillator starts near the maximum frequency of the voltage controlled oscillator and is swept downwardly toward its minimum frequency. During the sweep of the frequency, driver circuit 60 is providing a maximum drive signal 66 at a decreasing frequency. The frequency sweep continues until the phase locked loop voltage controlled oscillator output 58 reaches the tuning fork resonant frequency. At this frequency the phase locked loop will lock, the lock signal 96 generated by the phase locked loop circuit 56 will be provided to open the contacts of switch 92, removing the drive signal and allowing the phase detector output 72 to control the voltage controlled oscillator frequency at a resonant frequency of the tuning fork. Amplifier and driver 60 continues to drive tuning fork 64 at a maximum level until the desired amplitude of the tuning fork oscillation amplitude is reached.

CONCLUSION

Systems, devices, structures, and methods have been described to address situations relating to the rapid starting of drive circuits for resonant objects such as electrostatically driven tuning forks. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

What is claimed is:

1. A phase locked loop circuit for driving an oscillatory mechanical object, comprising:
    an amplifier for providing a drive signal to the mechanical object in response to an input signal;
    a phase detector for receiving a first signal and a second signal proportional to the movement of the mechanical object, the phase detector constructed and arranged for comparing the phase of the first and second signals and for providing an output signal having an average voltage proportional to the phase difference between the first and second signals;
    a voltage controlled oscillator receiving the output signal from the phase detector and producing an output signal which is the first signal received by the phase detector and an input of the amplifier;
    a signal source for providing the voltage controlled oscillator with a starting signal at the time that power is applied to the system such that the frequency of the output of the voltage controlled oscillator commences at an initial frequency of the voltage controlled oscillator which is higher than a resonant frequency of the mechanical object, the signal source constructed and arranged for reducing the output frequency of the voltage controlled oscillator until the it corresponds to the resonant frequency of the mechanical object.

2. The circuit of claim 1 wherein the starting signal is inoperative once the movement of the mechanical object reaches the resonant frequency.

3. The circuit of claim 1 wherein the amplifier is provided with automatic gain control.

4. The circuit of claim 1 wherein the signal source removes the starting signal when the oscillation of the mechanical object reaches the resonant frequency of the mechanical object.

5. The circuit of claim 1 wherein the mechanical object is a micromachined silicon tuning fork.

6. The circuit of claim 5 wherein the tuning fork is electrostatically driven by the amplifier.

7. A circuit for driving an oscillatory mechanical object at a resonant frequency, comprising:
    a voltage controlled oscillator;
    a driver circuit for providing a signal for driving the mechanical object at a frequency determined by the voltage controlled oscillator;
    a drive signal source for providing a starting drive signal to the voltage controlled oscillator when power is applied to the circuit prior to commencement of the oscillation of the mechanical object, the starting drive signal providing an output from the voltage controlled oscillator at a starting frequency predetermined to be above the range of expected resonant frequencies of the mechanical object, the starting drive signal varying with time to reduce the output frequency of the voltage controlled oscillator;
    a phase detector for comparing the phase difference between the output of the voltage controlled oscillator and a feedback signal indicative of the oscillatory motion of the mechanical object and providing an error signal to the input of the voltage controlled oscillator having an average voltage proportional to that phase difference; and
    a switch for removing the starting drive signal from the input of the voltage controlled oscillator when the frequency of the oscillatory motion of the mechanical object reaches a resonant frequency of the mechanical object.

8. The circuit of claim 7 wherein the mechanical object is a tuning fork.

9. The circuit of claim 8 wherein the tuning fork is an electrostatically driven micromachined silicon tuning fork.

10. The circuit of claim 7 wherein the switch connects the drive signal source to a source of reference potential in one condition and disconnects it to remove the drive signal from the input of the voltage controlled oscillator when the oscillation frequency of the mechanical object reaches a resonant frequency of the mechanical object.

11. A method of starting a closed loop resonant drive circuit for a mechanical object:
    providing an open loop starting signal to the circuit for initially driving the mechanical object at a frequency well above the range of frequencies expected for the resonant frequency of the mechanical object;
    varying the starting signal for sweeping the driving frequency to lower frequencies until the resonant frequency of the mechanical object is reached; and
    removing the starting signal while the mechanical object continues to oscillate at the resonant frequency.

12. The method of claim 11 wherein varying the open loop starting signal comprises decreasing the signal to gradually reduce the frequency at which the mechanical object is driven.

13. The method of claim 11 wherein removing the starting signal comprises actuating a switch to inactivate the open loop starting signal.

14. The method of claim 11 wherein the mechanical object is an electrostatically driven micromachined silicon tuning fork.

15. A method of rapidly initiating oscillation of a resonant mechanical system driven by a phase lock loop circuit comprising an amplifier having a positive feedback path:
    applying a decaying open loop starting voltage to the voltage controlled oscillator input of a phase lock loop circuit so that the phase lock loop circuit output frequency starts at a maximum frequency which is above the resonant frequency of the mechanical system and sweeps downwardly toward a minimum frequency below the resonant frequency of mechanical system;
    allowing the phase locked loop circuit to lock at the resonant frequency of the mechanical element when the frequency of voltage controlled oscillator reaches the resonant frequency of the mechanical system; and
    removing the starting voltage.

16. The method of claim 15 wherein the oscillation of the mechanical system continues to at the resonant frequency after removal of the starting signal.

17. The method of claim 15 wherein the resonant system comprises a tuning fork.

18. A method of rapidly initiating oscillation of a resonant mechanical system driven by a phase lock loop circuit comprising an amplifier having a positive feedback path:

applying a decaying open loop starting voltage to the voltage controlled oscillator input of a phase lock loop circuit so that the phase lock loop circuit output frequency starts at a maximum frequency which is above the resonant frequency of the mechanical system and sweeps downwardly toward a minimum frequency below the resonant frequency of mechanical system;

allowing the phase locked loop circuit to lock at the resonant frequency of the mechanical element when the frequency of the voltage controlled oscillator reaches the resonant frequency of the mechanical element;

generating a lock signal to indicate that the phase locked loop circuit is locked; and removing the starting voltage in response to the lock signal.

19. The method of claim 18 wherein the circuit continues to drive the mechanical system at the resonant frequency after the resonant frequency of the phase locked loop is reached.

20. The method of claim 18 wherein the resonant system comprises a tuning fork.

* * * * *